US007952917B2

(12) United States Patent
Xi et al.

(10) Patent No.: US 7,952,917 B2

(45) Date of Patent: May 31, 2011

(54) VARIABLE WRITE AND READ METHODS FOR RESISTIVE RANDOM ACCESS MEMORY

(75) Inventors: Haiwen Xi, Prior Lake, MN (US); Hongyue Liu, Maple Grove, MN (US); Xiaobin Wang, Chanhassen, MN (US); Yong Lu, Rosemount, MN (US); Yiran Chen, Eden Prairie, MN (US); Yuankai Zheng, Bloomington, MN (US); Dimitar V. Dimitrov, Edina, MN (US); Dexin Wang, Eden Prairie, MN (US); Hai Li, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/794,009

(22) Filed: Jun. 4, 2010

(65) Prior Publication Data

US 2010/0238712 A1 Sep. 23, 2010

Related U.S. Application Data

(62) Division of application No. 12/210,526, filed on Sep. 15, 2008, now Pat. No. 7,826,255.

(51) Int. Cl.

*G11C 11/00* (2006.01)
*G11C 11/14* (2006.01)
*G11C 11/15* (2006.01)

(52) U.S. Cl. ......... 365/158; 365/148; 365/171; 365/173

(58) Field of Classification Search .................. 365/158
See application file for complete search history.

(56) References Cited

U.S. PATENT DOCUMENTS 7,187,577 B1 3/2007 Wang
7,224,601 B2 5/2007 Panchula
7,272,034 B1 9/2007 Chen
7,272,035 B1 9/2007 Chen
7,289,356 B2 * 10/2007 Diao et al. .................... 365/158
7,345,912 B2 * 3/2008 Luo et al. ...................... 365/158
7,379,327 B2 5/2008 Chen
7,432,574 B2 * 10/2008 Nakamura et al. ............ 257/421
7,502,249 B1 3/2009 Ding
7,515,457 B2 4/2009 Chen
7,577,021 B2 * 8/2009 Guo et al. ..................... 365/158

(Continued)

OTHER PUBLICATIONS

Baek et al., Multi-Layer Cross-Point Binary Oxide Resistive Memory (OxRRAM) for Post-NAND Storage Application, 2005 IEEE.

(Continued)

*Primary Examiner* — Son L Mai

(74) *Attorney, Agent, or Firm* — Campbell Nelson Whipps LLC

(57) ABSTRACT

Variable write and read methods for resistance random access memory (RRAM) are disclosed. The methods include initializing a write sequence and verifying the resistance state of the RRAM cell. If a write pulse is needed, then two or more write pulses are applied through the RRAM cell to write the desired data state to the RRAM cell. Each subsequent write pulse has substantially the same or greater write pulse duration. Subsequent write pulses are applied to the RRAM cell until the RRAM cell is in the desired data state or until a predetermined number of write pulses have been applied to the RRAM cell. A read method is also disclosed where subsequent read pulses are applied through the RRAM cell until the read is successful or until a predetermined number of read pulses have been applied to the RRAM cell.

18 Claims, 6 Drawing Sheets

Normal Read
Self-Reference Read
CLK
RE
BL_Charge
Sense
Check

U.S. PATENT DOCUMENTS

| | | | | |
|---|---|---|---|---|
| 7,742,329 | B2 * | 6/2010 | Yoon et al. | 365/158 |
| 7,787,288 | B2 * | 8/2010 | Kitagawa et al. | 365/158 |
| 7,813,168 | B2 * | 10/2010 | Zhu et al. | 365/171 |
| 7,876,604 | B2 * | 1/2011 | Zheng et al. | 365/158 |
| 2006/0097288 | A1 | 5/2006 | Baek | |
| 2007/0195590 | A1 | 8/2007 | Sugita | |
| 2007/0217084 | A1 | 9/2007 | Xue | |
| 2007/0297223 | A1 * | 12/2007 | Chen et al. | 365/173 |
| 2008/0247222 | A1 * | 10/2008 | Jung et al. | 365/158 |
| 2008/0310213 | A1 * | 12/2008 | Chen et al. | 365/158 |
| 2008/0310219 | A1 | 12/2008 | Chen | |
| 2009/0040855 | A1 | 2/2009 | Luo | |
| 2009/0185410 | A1 | 7/2009 | Huai | |
| 2009/0323402 | A1 * | 12/2009 | Li et al. | 365/158 |

OTHER PUBLICATIONS

Baikalov, et al., Field-Driven Hystertic and Reversible Resistive Switch . . ., Appl. Phys. Lett. 83, 957 (2003).

Fujii et al., Hysteretic Current-Voltage Characteristics and Resitance Switching . . ., Appl. Phys. Lett. 86, 012107 (2005).

Rozenberg, et al., Nonvolatile Memory with Multilevel Switching: A Basic Model, Physical Review Letters, vol. 92, No. 17, pp. 178302-1-4, (2004).

T. Kawahara et al., 2Mb Spin-Transfer Torque RAM (SPRAM) with Bit-by-Bit BiDirectional Current Write . . ., 2007 IEEE Intl Solid-State Circuits Conference, Session 26.

M. Hosomi et al., A Novel Nonvolatile Memory with Spin-Torque Transfer Magnetization Switching: Spin-RAM, 2005 IEEE.

* cited by examiner

FIG. 6
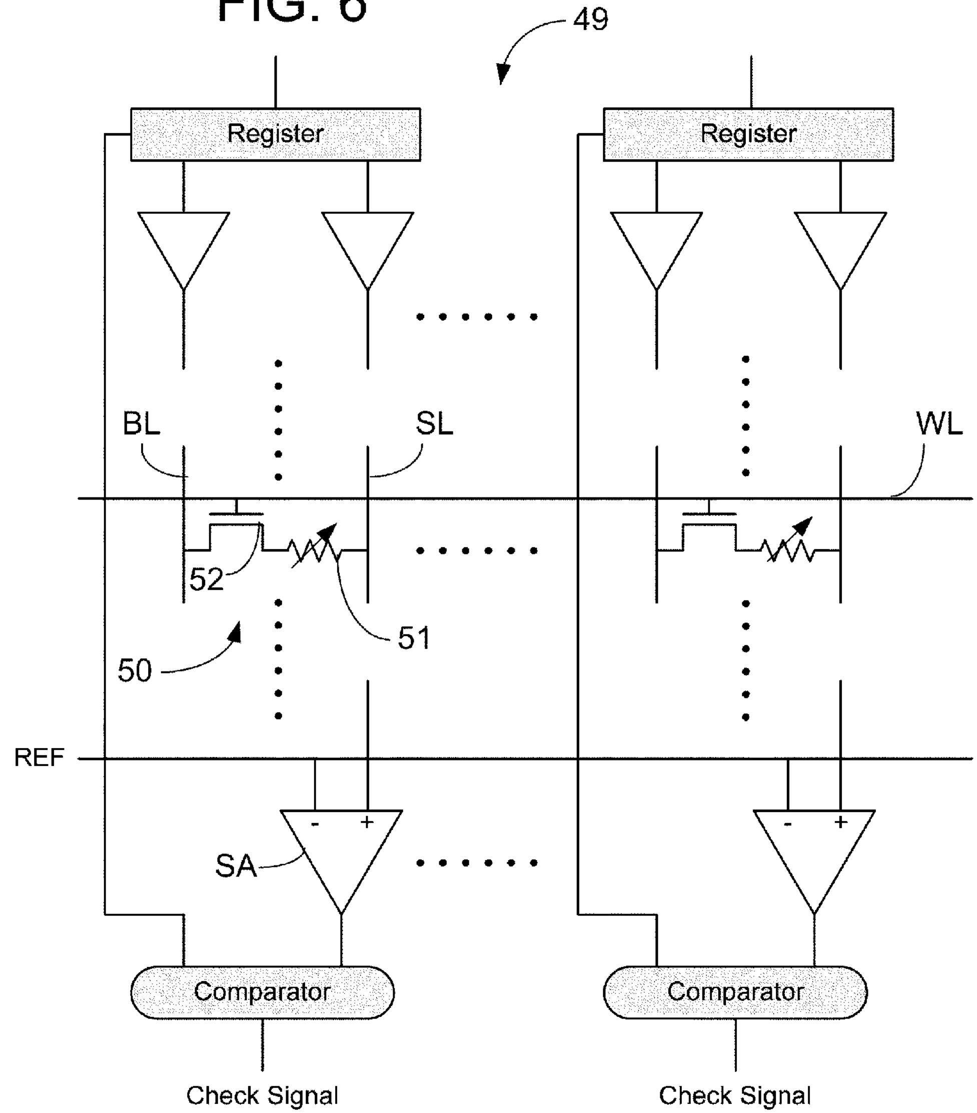
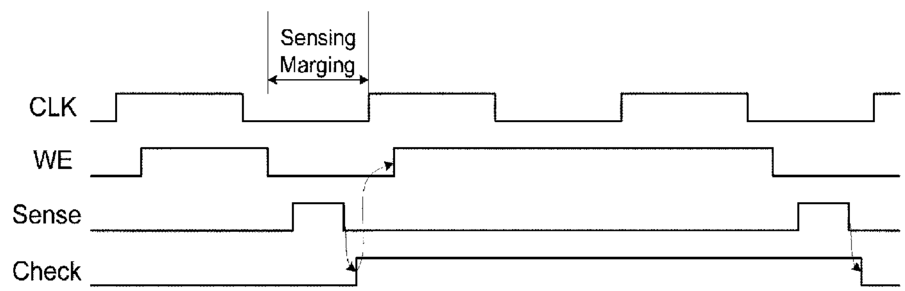
FIG. 7

VARIABLE WRITE AND READ METHODS FOR RESISTIVE RANDOM ACCESS MEMORY

CROSS-REFERENCE

This application is a divisional of application Ser. No. 12/210,526, filed Sep. 15, 2008, the contents of each is hereby incorporated by reference in its entirety.

BACKGROUND

Nonvolatile memory is a type of memory that retains stored data when power is removed from the memory. Thus, nonvolatile memory devices are being widely employed in computers, mobile communication terminals, memory cards, and the like. There are various types of nonvolatile memories including e.g., flash memory.

A flash memory device is commonly used as a nonvolatile memory device. In general, the flash memory device includes memory cells, each of which has a stacked gate structure. The stacked gate structure may include a tunnel oxide layer, a floating gate, an inter-gate dielectric layer, and a control gate electrode, which are sequentially stacked on a channel region.

Recently, new nonvolatile memory devices, such as a resistance random access memory (RRAM), have been proposed. A unit cell of the RRAM includes a data storage element which has two electrodes and a variable resistive material layer interposed between the two electrodes. The variable resistive material layer, i.e., a data storage material layer, has a reversible variation in resistance according to the whether a filament, a conductive path or a low resistive path is formed through the resistive material layer by the electrical signal (voltage or current) applied between the electrodes.

A new write mechanism, which is based upon spin polarization current induced magnetization switching, has been introduced to the RRAM design. This new RRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional RRAM.

While RRAM appears to be a promising nonvolatile memory, there are a number of challenges with RRAM. One illustrative challenge is that the distribution of the write pulse and of the cell resistance for an RRAM memory array appears to be wide, which results in difficulty in writing and reading the RRAM memory array.

BRIEF SUMMARY

The present disclosure relates to a variable write and read methods for resistive random access memory (RRAM). In particular, the methods described herein enhance the writability and readability of RRAM and in particular spin torque memory that is based on write current dependence on the write pulse width (i.e., duration). The methods described herein provide memory cell writing and reading within the transistor driving current capability without overly sacrificing write or read speed.

In one particular embodiment, a variable write method for resistance random access memory (RRAM) includes setting a write counter to zero and reading a resistance value across an RRAM cell, if the resistance value indicates that the RRAM cell is in a desired data state for a bit to be written, then the write method is complete. If the resistance value indicates that the RRAM cell is not in the desired data state for a bit to be written then the method includes applying a first write pulse across the RRAM cell, the first write pulse having an amplitude and a first write pulse duration and incrementing the counter by one. Then the method includes reading a resistance value across the RRAM cell, if the resistance value indicates that the RRAM cell is in the desired data state for the bit to be written, then the write method is complete, otherwise, the method includes applying a second write pulse across the RRAM cell, the second write pulse has a substantially similar amplitude as the first write pulse and the second write pulse has a second write pulse duration being greater than the first write pulse duration and incrementing the counter by one. Then the method includes reading a resistance value across the RRAM cell, if the resistance value indicates that the RRAM cell is in the desired data state for the bit to be written, then the write method is complete, otherwise, subsequent write pulses are applied across the RRAM cell, each subsequent write pulse has a substantially similar amplitude as the first write pulse and each subsequent write pulse has a write pulse duration being greater than a previous write pulse duration and incrementing the counter by one.

In another particular embodiment, a variable read method for spin-transfer torque random access memory (STRAM) includes applying two or more read pulses across an STRAM cell to read a desired data state of the STRAM cell, each read pulse has a substantially similar amplitude, and each subsequent read pulse has a substantially similar duration or an increasing duration and incrementing a counter by one for each read pulse application. Then the method includes checking a read content from the STRAM cell, if the read is successful then the read method is complete, otherwise the applying step is repeated.

These and various other features and advantages will be apparent from a reading of the following detailed description.

BRIEF DESCRIPTION OF THE DRAWINGS

The disclosure may be more completely understood in consideration of the following detailed description of various embodiments of the invention in connection with the accompanying drawings, in which:

FIG. 6 is a schematic circuit diagram of a STRAM array;

FIG. 7 is a timing diagram of an illustrative write operation;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
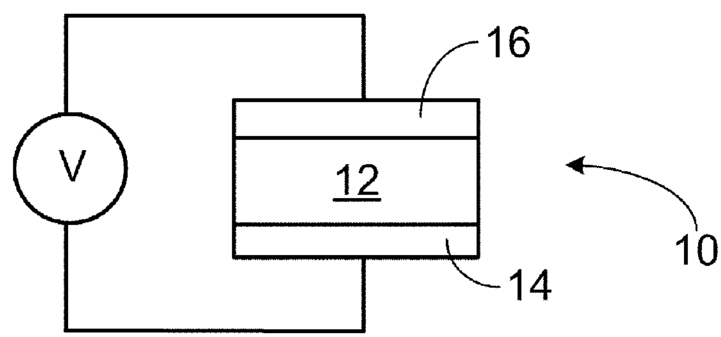
FIG. 1 is a schematic diagram of an illustrative resistive random access memory cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a variable write and read methods for resistive random access memory (RRAM). In particular, the methods described herein enhance the writability and readability of RRAM and in particular spin torque memory that is based on write or read current dependence on the write or read pulse duration. The methods described herein provide memory cell writing and reading within the transistor driving current capability without overly sacrificing write or read speed. The methods include initializing a write sequence and verifying the resistance state of the RRAM cell. If a write pulse is needed, then two or more write pulses are applied through the RRAM cell to write the desired data state to the RRAM cell. Each subsequent write pulse has substantially the same or greater write pulse duration. Subsequent write pulses are applied to the RRAM cell until the RRAM cell is in the desired data state or until a predetermined number of write pulses have been applied to the RRAM cell. A read method is also disclosed where subsequent read pulses are applied through the RRAM cell until the read is successful or until a predetermined number of read pulses have been applied to the RRAM cell. While the present invention is not so limited, an appreciation of various aspects of the invention will be gained through a discussion of the examples provided below.

Figure 2:
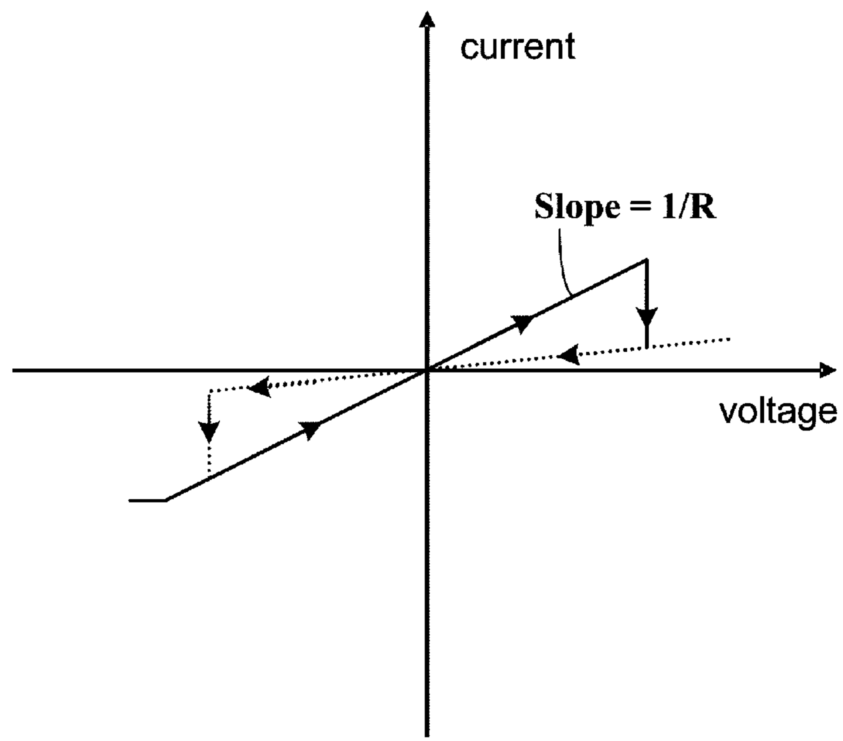
FIG. 2 is a graph of an exemplary hysteretic resistance change for the illustrative resistive random access memory cell of FIG. 1.

FIG. 1 is a schematic diagram of an illustrative resistive random access memory (RRAM) cell 10. FIG. 2 is a graph of an exemplary hysteretic resistance change for the illustrative resistive random access memory cell 10 of FIG. 1 due to the electrical pulse induced resistance change effect. The RRAM cell 10 includes a medium layer 12 that responds to an electrical current or voltage pulse by altering an electrical resistance of the medium layer 12. This phenomenon can be referred to as the electrical pulse induced resistance change effect. This effect changes the resistance (i.e., data state) of the memory from a one or more high resistance state(s) to a low resistance state, for example. The medium layer 12 is interposed between a first electrode 14 and a second electrode 16 and acts as a data storage material layer of the RRAM cell. The first electrode 14 and a second electrode 16 are electrically connected to a voltage source V. The first electrode 14 and a second electrode 16 can be formed of any useful electrically conducting material such as, for example, a metal.

The material forming the medium layer 12 can be any known useful RRAM material. In some embodiments, the material forming the medium layer 12 includes an oxide material such as, for example, a metal oxide. In some embodiments, the metal oxide is a binary oxide material or complex metal oxide material. In other embodiments, the material forming the medium layer 12 includes a chalcogenide solid electrolyte material or an organic/polymer material.

The binary metal oxide material can be expressed as a chemical formula of $M_xO_y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 12 include CuO, NiO, CoO, ZnO, $CrO_2$, $TiO_2$, $HfO_2$, $ZrO_2$, $Fe_2O_3$, and $Nb_2O_5$.

In some embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_xSe_{100-x}$) containing a silver (Ag) component. One example of an organic material is Poly(3,4-ethylenedioxythiophene) (i.e., PEDOT).

The exemplary RRAM cell 10 medium layer 12 has a reversible variation in resistance, which can be sensed at a voltage of, for example less than 4 V, or less than 3 V or less than 2 V. A plurality of RRAM cells 10 can be configured in an array to form the memory device. The exemplary RRAM cell 10 can be fabricated utilizing conventional semiconductor fabrication techniques. The hardware implementations of this method is not particularly limited in order to obtain a control unit that is able to perform the correct and proper sequence described by the method herein. For example, one approach includes a sequencer and a finite state machine.

Figure 3:
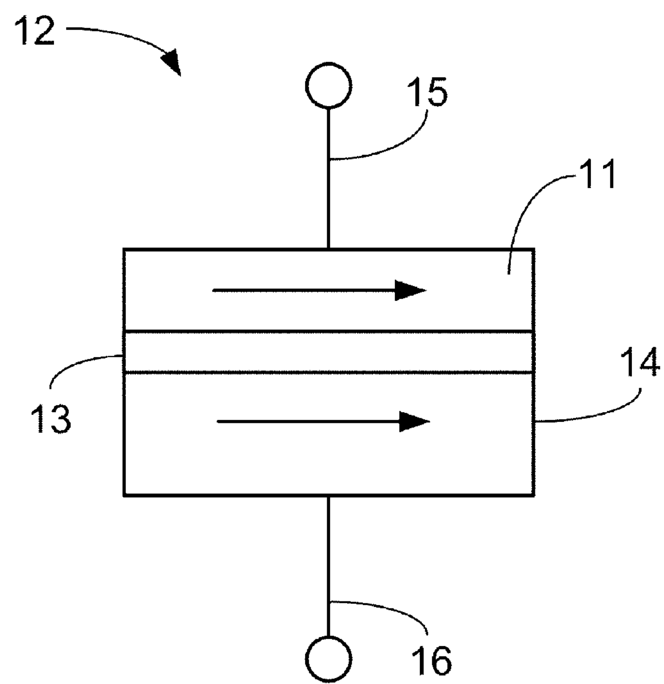
FIG. 3 a schematic diagram of an illustrative spin-transfer torque random access memory (STRAM) cell in the low resistance state.

FIG. 3 a schematic diagram of an illustrative spin-transfer torque random access memory (STRAM) cell 12. The variable resistive memory cell 12 includes a ferromagnetic free layer 11 and a ferromagnetic reference (i.e., pinned) layer 14. The ferromagnetic free layer 11 and a ferromagnetic reference layer 14 are separated by an oxide barrier layer 13 or tunnel barrier. A first electrode 15 is in electrical contact with the ferromagnetic free layer 11 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 11, 14 to a control circuit providing read and write currents through the ferromagnetic layers 11, 14. The resistance across the magnetic tunnel junction data cell 12 is determined by the relative orientation of the magnetization vectors or magnetization orientations of the ferromagnetic layers 11, 14. The magnetization direction of the ferromagnetic reference layer 14 is pinned in a predetermined direction while the magnetization direction of the ferromagnetic free layer 11 is free to rotate under the influence of a spin torque. Pinning of the ferromagnetic reference layer 14 may be achieved through, e.g., the use of exchange bias with an antiferromagnetically ordered material such as PtMn, IrMn and others.

Figure 4:
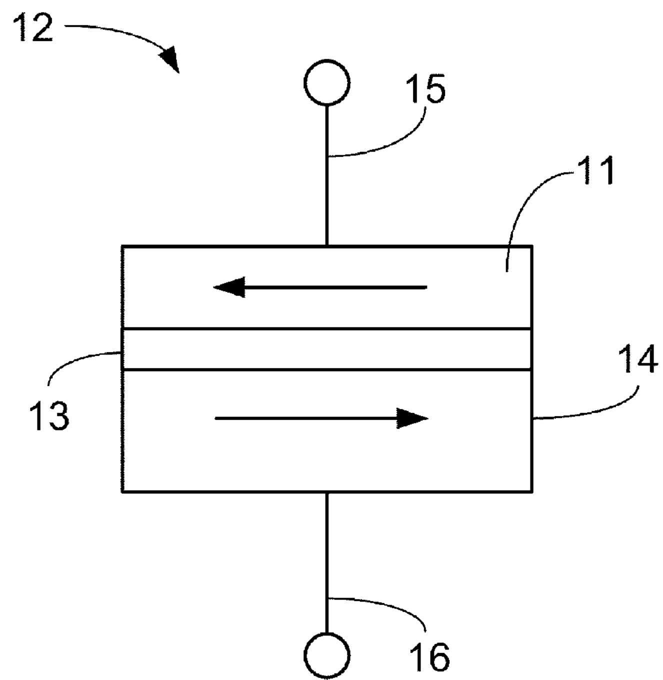
FIG. 4 a schematic diagram of an illustrative spin-transfer torque random access memory (STRAM) cell in the high resistance state.

FIG. 3 a schematic diagram of an illustrative spin-transfer torque random access memory (STRAM) cell 12 in the low resistance state where the magnetization orientation of the ferromagnetic free layer 11 is parallel and in the same direction of the magnetization orientation of the ferromagnetic reference layer 14. This is termed the low resistance state or "0" data state. FIG. 4 illustrates the STRAM cell 12 in the high resistance state where the magnetization orientation of the ferromagnetic free layer 11 is anti-parallel and in the opposite direction of the magnetization orientation of the ferromagnetic reference layer 14. This is termed the high resistance state or "1" data state.

Switching the resistance state and hence the data state of the STRAM cell 12 via spin-transfer occurs when a current, passing through a magnetic layer of the STRAM cell 12, becomes spin polarized and imparts a spin torque on the free layer 11 of the STRAM cell 12. When a sufficient spin torque is applied to the free layer 11, the magnetization orientation of the free layer 11 can be switched between two opposite directions and accordingly the STRAM cell 12 can be switched between the parallel state (i.e., low resistance state or "0" data state) and anti-parallel state (i.e., high resistance state or "1" data state) depending on the direction of the current.

The illustrative STRAM cell 12 may be used to construct a memory device that includes multiple variable resistive memory cells where a data bit is stored in magnetic tunnel junction data cell by changing the relative magnetization state of the free magnetic layer 11 with respect to the pinned magnetic layer 14. The stored data bit can be read out by measuring the resistance of the cell which changes with the magnetization direction of the free layer relative to the pinned magnetic layer. In order for the STRAM cell 12 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 5:
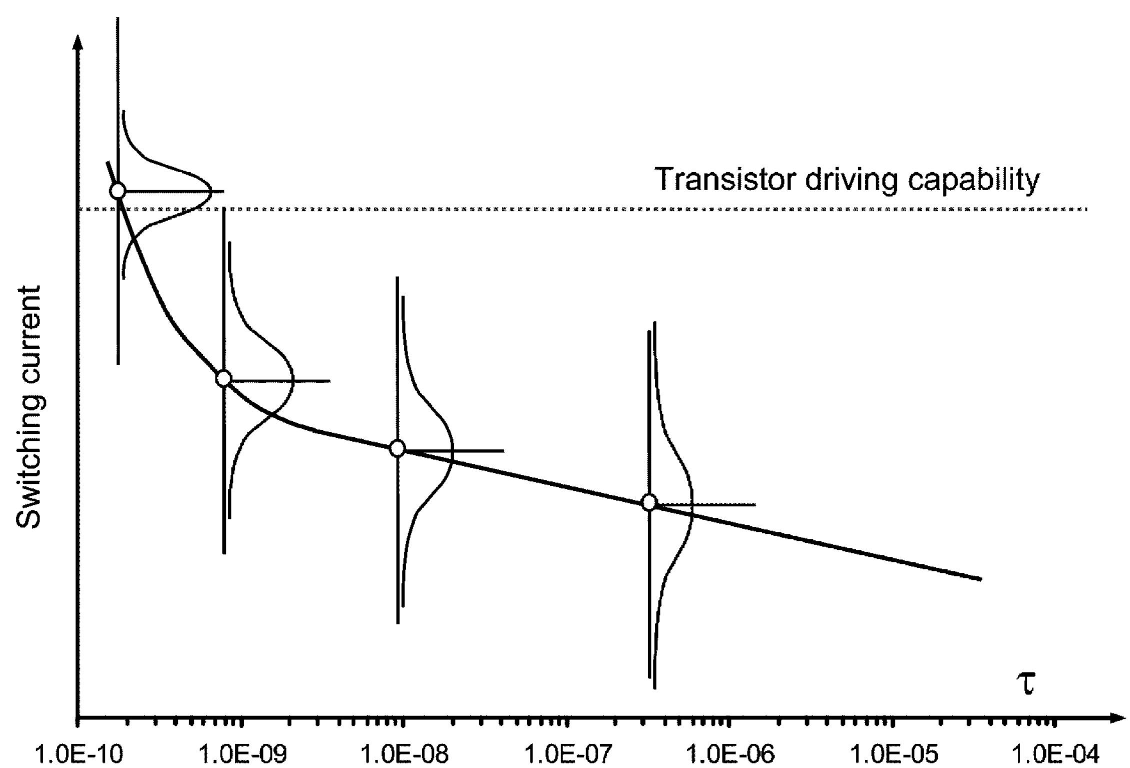
FIG. 5 is a graph of exemplary switching current distributions for STRAM cells at four different write pulse durations.

FIG. 5 is a graph of exemplary switching current distributions for STRAM cells at four different write pulse durations (i.e., widths). Switching current increases along the vertical axis and time (in seconds) increases along the horizontal axis. In many embodiments, the STRAM cell is electrically connected to a transistor such as, for example, an NMOS device. The transistor has a maximum current driving capability for passing current through the STRAM cell, which means that current passing through the memory cell that is connected to the transistor can not exceed that limit. This maximum current driving capability is illustrated at the horizontal dotted line in FIG. 5. This figure illustrates the dependence of the switching current on the pulse duration (i.e., width) $\tau$. For the pulse duration longer or greater than around $10^{-8}$ sec, thermal activation plays a role in assisting the switching. For the pulse duration of less than around $10^{-8}$ sec, the magnetization switching does not get much help from thermal activation. As illustrated in FIG. 5, the switching current distribution is wider for longer pulse length. In an array of STRAM cells, there are a certain number of STRAM cells that have a switching current higher than the transistor driving capability, however applying a subsequent and longer write pulse allows the STRAM to switch. In many embodiments, the initial write pulse is less than $1\times10^{-8}$ sec and the subsequent write pulses are equal to or greater than $1\times10^{-8}$ sec.

FIG. 6 is a schematic circuit diagram of a STRAM array 49. The STRAM array 49 includes a plurality of STRAM memory units 50 arranged in an array 49. Each STRAM memory unit 50 includes a STRAM cell 52 (described above) electrically between a bit line BL and a source line SL. An access transistor 51 is electrically between the source line and the STRAM cell 52. The transistor 51 is electrically couple to a word line WL to allow selection of the transistor 51 for read and write current to flow though the STRAM cell 52. A reference voltage REF is provided to a sense amplifier SA with the read voltage from the selected STRAM memory unit 50. A Comparator compares the output from the sense amplifier SA with the output from the Register to provide a Check Signal for the read or write operation.

FIG. 7 is a timing diagram of an illustrative write operation. The timing diagram includes a clock module CLK, a write module WE, a sense module Sense, and a check module Check. As illustrated a first write WE pulse is initiated and then a Sense operation determines if the STRAM cell has been written, if not, the Check operation holds (provides a "hold" signal) the writing operation and initiates subsequent longer write WE pulses until a "go" signal is indicated. Then the Sense operation determines if the STRAM cell has been written. In this example, the second longer write WE operation placed the STRAM cell in the desired resistance state. Thus, the Check operation ends the write operation. As indicated the Sensing Margin includes the time for the Sense and Check operation following the end of the first write WE operation. In many embodiments, input buffers within the STRAM array hold the data between the STRAM sending the "hold" signal and the STRAM being released from the writing operation.

Figure 8:
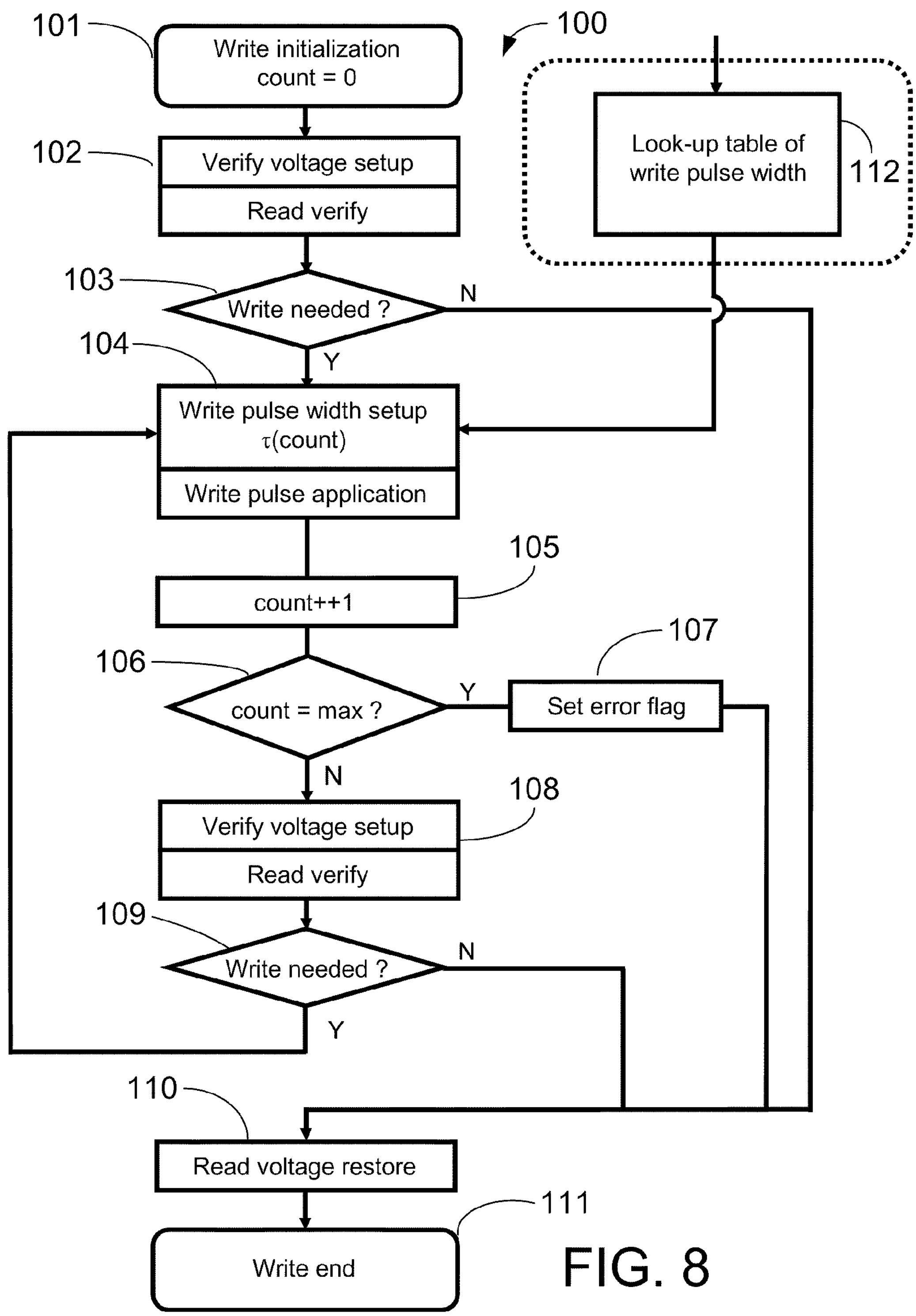
FIG. 8 is a flowchart of one illustrative variable write method.

FIG. 8 is a flowchart 100 of one illustrative variable write method. As described above, instead of a single-shot write voltage pulse, two or more write pulses are utilized. First the write is initialized and a counter is set to zero at block 101, then the RRAM or STRAM cell is verified for resistance (verify current high or low resistance state) at block 102. If (decision block 103) the RRAM or STRAM cell is already in the desired resistance state, then the write operation is not needed and the operation proceeds to the Read voltage restore at block 110 and the write operation ends at block 111. Otherwise a write pulse is applied, at block 104, to the RRAM or STRAM cell to switch the resistance state of the RRAM or STRAM cell and the counter in incremented by one at block 105. The write pulse duration can be increased or remain the same, as desired for each write pulse.

If (decision block 106) the counter value is equal to a determined maximum counter value then the RRAM or STRAM cell is assigned an error flag, at block 107, and exits the write process to blocks 110 and 111. Otherwise the RRAM or STRAM cell is verified for resistance at block 108, and if (decision block 109) the RRAM or STRAM cell is in the desired resistance state, then the write operation proceeds to the Read voltage restore at block 110 and the write operation ends at block 111. Otherwise a write pulse is applied, at block 104, to the RRAM or STRAM cell to switch the resistance state of the RRAM or STRAM cell and the counter in incremented by one at block 105. The write pulse duration can be increased or remain the same, as desired for each write pulse.

In many embodiments, each successive write pulse has a longer or greater write pulse duration or width. In some of these embodiments, each successive write pulse has a linearly increasing write pulse width or duration. In other embodiments, each successive write pulse is a first or second order function of the count. In some embodiments, each successive write pulse has a write pulse duration or width that is determined by a look-up table at block 112. The look-up table provides a predetermined write pulse duration based on the count value of the counter. In one embodiment, the write pulses have substantially the same pulse width or duration. In other embodiments, only selected write pulses have substantially the same pulse width or duration. In other embodiments, none of the write pulses have substantially the same pulse width or duration.

Similar to the variable write operation described above, a variable read operation is also disclosed. The variable read operation ensures that substantially all of the STRAM cells can be read successfully. After every read operation, the content read from the STRAM cell is checked by ECC to make sure that it has been read successfully. This check can be preformed in the same cycle. For the memory cells that cannot be read successfully, the system will read it again with a longer read pulse or the same read pulse. If the STRAM cell needs to re-read, a "hold" signal is generated to tell the system to hold the data until another "go" signal is sent. The "hold" and "go" signal can be the latched different state of data check signal. Input buffers within the STRAM cell can be used to hold the data between STRAM sending "hold" signal and STRAM being released from the variable reading operation.

In many embodiments, each successive read pulse has a longer or greater read pulse duration or width. In some of these embodiments, each successive read pulse has a linearly increasing read pulse width or duration. In other embodiments, each successive read pulse is a first or second order function of the count. In some embodiments, each successive read pulse has a read pulse duration or width that is determined by a look-up table. The look-up table provides a predetermined read pulse duration based on the count value of the counter. In one embodiment, the read pulses have substantially the same pulse width or duration. In other embodiments, only selected read pulses have substantially the same pulse width or duration. In other embodiments, none of the read pulses have substantially the same pulse width or duration.

Figure 9:
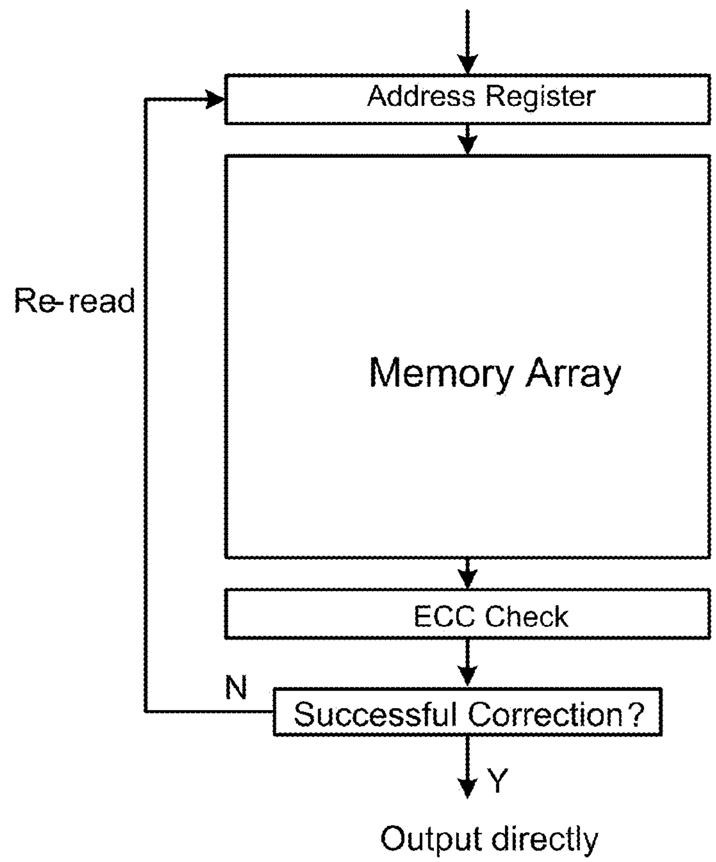
FIG. 9 is a schematic diagram of a variable read operation.
Figure 10:
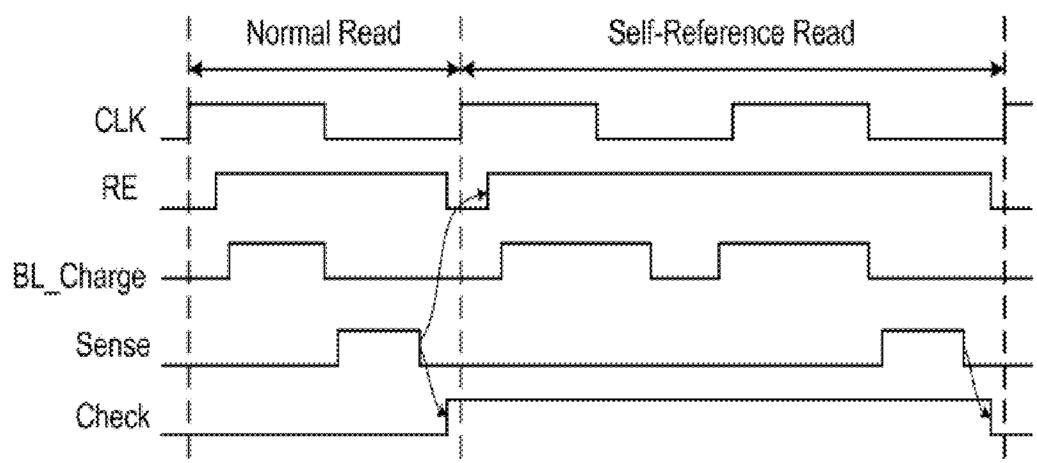
FIG. 10 is a timing diagram of a variable read operation.

FIG. 9 is a schematic diagram of a variable read operation and FIG. 10 is a timing diagram of a variable read operation. The read operation is initiated in the Address Register and provides a read signal or read pulse to a particular STRAM cell in the Memory Array. An ECC Check operation determines is the STRAM cell had a successful read, if not the STRAM cell is Re-read with another read pulse that can be the same duration or a longer duration read pulse, as described above. The operation continues until a successful read occurs or until a predetermined number of reads are counted and an error code or flag is issued.

The timing diagram of FIG. 10 includes a clock module CLK, a read module RE, a bit line charge module BL_CHARGE, a sense module Sense, and a check module Check. As illustrated a first read RE pulse is initiated and then a Sense operation determines if the STRAM cell has been read, if not, the Check operation holds (provides a "hold" signal) the read operation initiates subsequent longer read RE pulses until a "go" signal is indicated. Then the Sense operation determines if the STRAM cell has been successfully read. In this example, the second longer read RE operation successfully reads the STRAM cell. Thus, the Check operation ends the read operation. As indicated the entire variable read operation includes a typical single shot read operation labeled "Normal Read" plus the additional hold the read operation labeled "Self-Reference Read". In many embodiments, input buffers within the STRAM array hold the data between the STRAM sending the "hold" signal and the STRAM being released from the reading operation.

Thus, embodiments of the VARIABLE WRITE AND READ METHODS FOR RESISTIVE RANDOM ACCESS MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A variable read method for spin-transfer torque random access memory (STRAM), the method comprising:

applying two or more read pulses across an STRAM cell to read a desired data state of the STRAM cell, each read pulse has a substantially similar amplitude, and each subsequent read pulse has a duration and incrementing a counter by one for each read pulse application;

checking a read content from the STRAM cell, if the read is successful then the read method is complete, otherwise the applying step is repeated.

2. A method according to claim 1, further comprising counting the number of read pulses applied across the STRAM cell, wherein the method continues until the read is successful.

3. A method according to claim 1, further comprising counting the number of read pulses applied across the STRAM cell, wherein the method continues until the counter reaches a predetermined integer.

4. A method according to claim 1, wherein each read pulse duration is determined by a look-up table.

5. A method according to claim 3, further comprising generating an error code or flag if the counter reaches the predetermined integer.

6. A method according to claim 1, wherein the checking step comprises utilizing an error correcting code.

7. A method according to claim 1, wherein each read pulse duration is substantially similar duration.

8. A method according to claim 1, wherein each read pulse duration is different.

9. A method according to claim 1, wherein each subsequent read pulse duration is a first or second order function of the counter.

10. A variable read method for spin-transfer torque random access memory (STRAM), the method comprising:

applying two or more read pulses across an STRAM cell to read a desired data state of the STRAM cell, each read pulse has a substantially similar amplitude, and each subsequent read pulse has an increasing duration and incrementing a counter by one for each read pulse application;

checking a read content from the STRAM cell, if the read is successful then the read method is complete, otherwise the applying step is repeated.

11. A method according to claim 10, further comprising counting the number of read pulses applied across the STRAM cell, wherein the method continues until the read is successful.

12. A method according to claim 10, further comprising counting the number of read pulses applied across the STRAM cell, wherein the method continues until the counter reaches a predetermined integer.

13. A method according to claim 10, wherein each read pulse duration is determined by a look-up table.

14. A method according to claim 12, further comprising generating an error code or flag if the counter reaches the predetermined integer.

15. A method according to claim 10, wherein the checking step comprises utilizing an error correcting code.

16. A method according to claim 10, wherein each subsequent read pulse duration increases linearly.

17. A method according to claim 10, wherein each subsequent read pulse duration is a first or second order function of the counter.

18. A method according to claim 10, wherein each read pulse duration is different.

* * * * *